United States Patent
Kamphuis et al.

(10) Patent No.: US 11,881,425 B2
(45) Date of Patent: Jan. 23, 2024

(54) TECHNIQUE FOR HANDLING DICED WAFERS OF INTEGRATED CIRCUITS

(71) Applicant: NXP B.V., Eindhoven (NL)

(72) Inventors: Antonius Hendrikus Jozef Kamphuis, Lent (NL); Guido Albermann, Hamburg (DE); Johannes Cobussen, Beuningen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/047,329

(22) Filed: Oct. 18, 2022

(65) Prior Publication Data
US 2023/0061529 A1 Mar. 2, 2023

Related U.S. Application Data

(62) Division of application No. 16/674,399, filed on Nov. 5, 2019, now Pat. No. 11,508,606.

(51) Int. Cl.
*B29C 65/00* (2006.01)
*H01L 21/683* (2006.01)
(Continued)

(52) U.S. Cl.
CPC ........ *H01L 21/6836* (2013.01); *H01L 21/673* (2013.01); *B29C 65/50* (2013.01);
(Continued)

(58) Field of Classification Search
CPC ....... B29C 65/50; B29C 65/565; B29C 65/58; H01L 21/6838
See application file for complete search history.

(56) References Cited

U.S. PATENT DOCUMENTS

| 4,140,260 A | 2/1979 | Gantley |
| 5,310,104 A | 5/1994 | Zaidel et al. |

(Continued)

FOREIGN PATENT DOCUMENTS

| CN | 101887841 A | 11/2010 |
| CN | 102206469 A | 10/2011 |
| TW | 201604943 A | 2/2016 |

OTHER PUBLICATIONS

"Semi G74-0699 Specification for Tape Frame for 300 mm Wafers," Jun. 1998, pp. 1-3, Semi.

(Continued)

*Primary Examiner* — Philip C Tucker
*Assistant Examiner* — Nickolas R Harm (57) ABSTRACT

A technique for handling an integrated circuit/tape assembly having a plurality of integrated circuits supported by underlying dicing tape involves placing the integrated circuit/tape assembly on a bottom file frame carrier (FFC) frame having structure (e.g., an inner rim or flexible pegs), placing a top FFC frame having a central opening over the integrated circuit/tape assembly, and mating the top and bottom FFC frames such that the dicing tape is pulled over the structure thereby laterally stretching the dicing tape, which breaks wafer saw bows holding the integrated circuits together. The lateral stretching of the dicing tape increases distance between adjacent integrated circuits in at least two mutually orthogonal lateral directions, thereby inhibiting the adjacent integrated circuits from colliding during shipment or storage for subsequent processing. The resulting assembly can be thinner than conventional FFC configurations, which results in more efficient shipment and storage.

20 Claims, 12 Drawing Sheets

(51) Int. Cl.
*H01L 21/673* (2006.01)
*B29C 65/56* (2006.01)
*B29C 65/58* (2006.01)
*B29C 65/50* (2006.01)

(52) U.S. Cl.
CPC ............ *B29C 65/565* (2013.01); *B29C 65/58* (2013.01); *H01L 21/6838* (2013.01); *H01L 2221/68327* (2013.01)

(56) References Cited

U.S. PATENT DOCUMENTS

| | | |
|---|---|---|
| 5,809,624 A | 9/1998 | Nakamae et al. |
| 2008/0032489 A1 | 2/2008 | Formosa |
| 2008/0105383 A1 | 5/2008 | Kubo et al. |
| 2009/0061596 A1 | 3/2009 | Takahashi et al. |
| 2012/0009763 A1* | 1/2012 | Jarry ................. H01L 21/67132 257/E21.599 |
| 2014/0339673 A1 | 11/2014 | Shoichi et al. |
| 2018/0033665 A1 | 2/2018 | Niederhofer et al. |
| 2018/0308711 A1 | 10/2018 | Obata |
| 2020/0027772 A1 | 1/2020 | Sherbin et al. |
| 2020/0083076 A1 | 3/2020 | Esteron et al. |
| 2021/0134647 A1 | 5/2021 | Kamphuis et al. |
| 2021/0134648 A1 | 5/2021 | Kemphuis et al. |

OTHER PUBLICATIONS

Non-final office action dated Mar. 29, 2022 in U.S. Appl. No. 16/674,399.
Notice of Allowance dated Jul. 22, 2022 in U.S. Appl. No. 16/674,399.
Non-final office action dated Sep. 7, 2022 in U.S. Appl. No. 16/843,461.

* cited by examiner

TECHNIQUE FOR HANDLING DICED WAFERS OF INTEGRATED CIRCUITS

CROSS-REFERENCE TO RELATED APPLICATIONS

This application is a divisional application of a U.S. patent application entitled "TECHNIQUE FOR HANDLING DICED WAFERS OF INTEGRATED CIRCUITS", having a Ser. No. 16/674,399, having a filing date of Nov. 5, 2019, having common inventors, and having a common assignee, all of which is incorporated by reference in its entirety.

BACKGROUND

Field of the Invention

The present invention relates to integrated circuits and, more specifically but not exclusively, to techniques for handling diced wafers of integrated circuits for storage and shipping.

Description of the Related Art

This section introduces aspects that may help facilitate a better understanding of the disclosure. Accordingly, the statements of this section are to be read in this light and are not to be understood as admissions about what is prior art or what is not prior art.

In integrated circuit (IC) fabrication, it is known to form many instances of an integrated circuit on a single substrate wafer and subsequently separate those instances for packaging into individual packaged IC devices. In certain IC fabrication techniques, after the integrated circuits are formed on the wafer, dicing tape is applied to one surface of the wafer, and plasma dicing is applied to the other side of the wafer to remove most, but not all, of the substrate material holding the different instances of the integrated surface together. The remaining substrate material, referred to as saw bows, are thin lengths of substrate material linking adjacent integrated circuits together. The diced wafer/tape assembly is then secured within a film frame carrier (FFC) that allows stretching of the dicing tape and thereby the wafer in all directions within the plane of the wafer, causing the saw bows to break and establishing physical separation between adjacent integrated circuits. This stretching of the dicing tape needs to be fixed/secured. The assembly, which now consists of the dicing tape supporting the many separated integrated circuits and secured within the FFC, can be stored and/or shipped for subsequent processing (i.e., packaging the individual integrated circuits) without risking damage to the integrated circuits as a result of adjacent integrated circuits colliding with one another during movement of the assembly.

Figure 1:
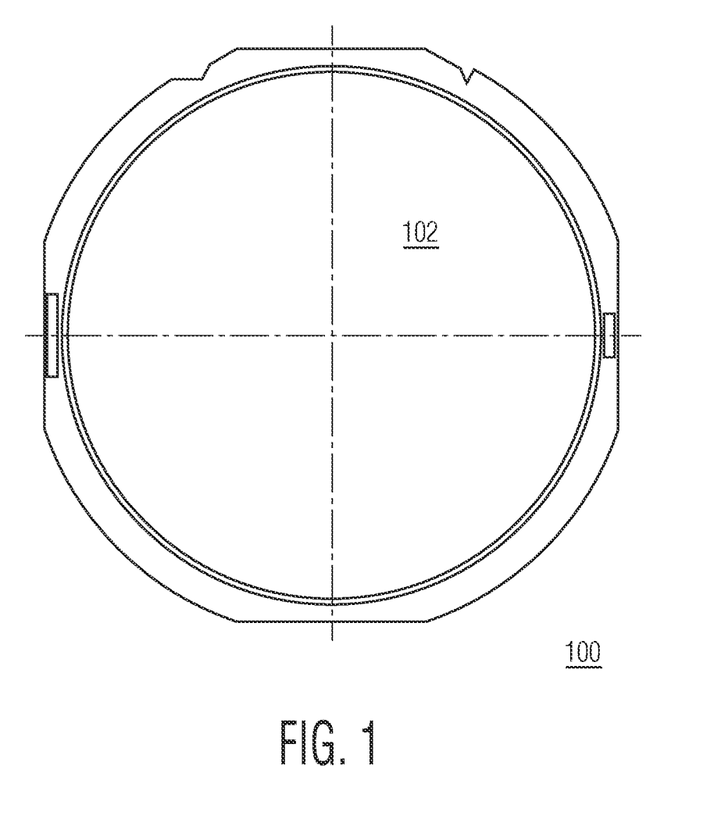
FIG. 1 is a plan view of a conventional single-piece FFC frame.

FIG. 1 is a plan view of a conventional single-piece FFC frame 100 having a circular opening 102. The FFC frame 100, which can be made of either metal or plastic, can hold the dicing tape, but cannot be used to stretch the dicing tape and fix the stretch on its own.

Figure 2A:
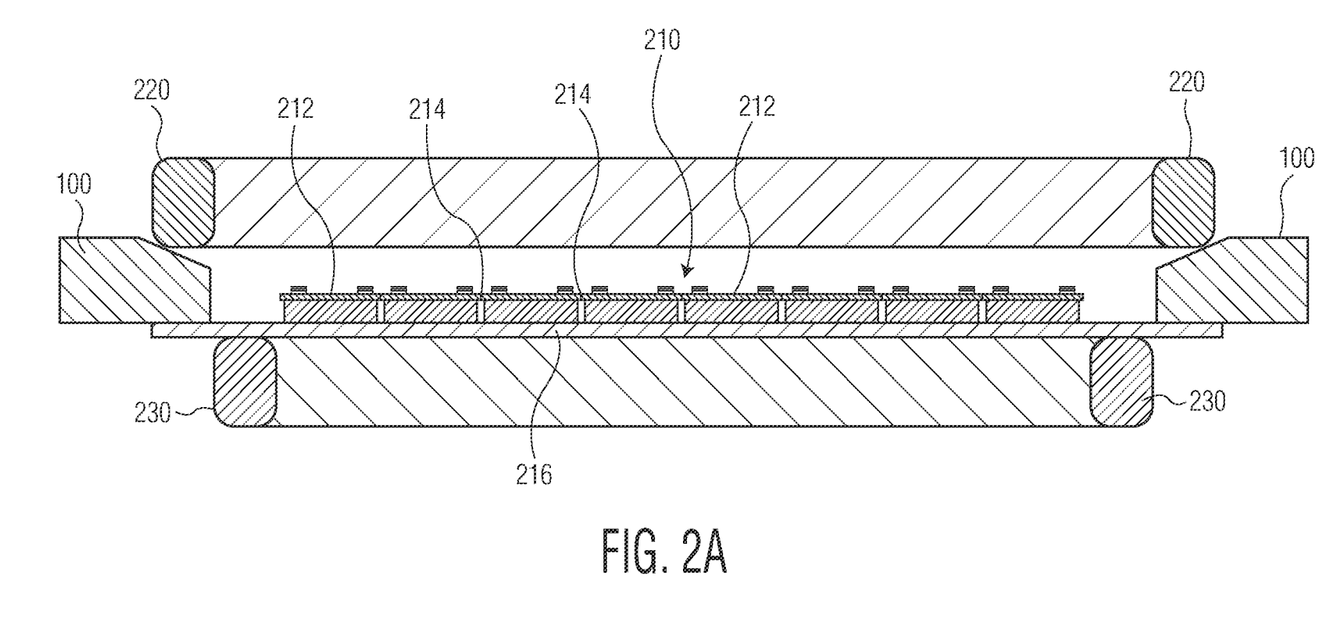
FIG. 2A is a cross-sectional side view showing a diced wafer/tape assembly with an FFC outer ring and the FFC frame of FIG. 1 positioned above the assembly and with an FFC inner ring positioned below.

FIG. 2A is a cross-sectional side view showing a diced wafer/tape assembly 210 having integrated circuits 212 interconnected by saw bows 214 and supported by dicing tape 216. As shown in FIG. 2A, an FFC outer ring 220 and the FFC frame 100 of FIG. 1 are positioned above the assembly 210 with an FFC inner ring 230 positioned below. The FFC outer and inner grip rings 220 and 230 form a grip ring set that enables the dicing tape 216 to be stretched and secured between the two rings, after which the FFC frame 100 can be cut off from the assembly. As represented in FIG. 2A, the inner diameter of the FFC outer ring 220 and the circular opening 102 in the FFC frame 100 are both slightly larger than the outer diameter of the FFC inner ring 230. Note that the dicing tape 216 extends laterally beyond the integrated circuits 212 such that at least some of the bottom surface of the FFC frame 100 rests on the periphery of dicing tape 216. To secure the assembly 210 within the FFC frame 100, the FFC inner ring 230 is pushed through the circular opening 102 of the FFC frame 100 and into the FFC outer ring 220, e.g., using an excentre press (not shown).

Figure 2B:
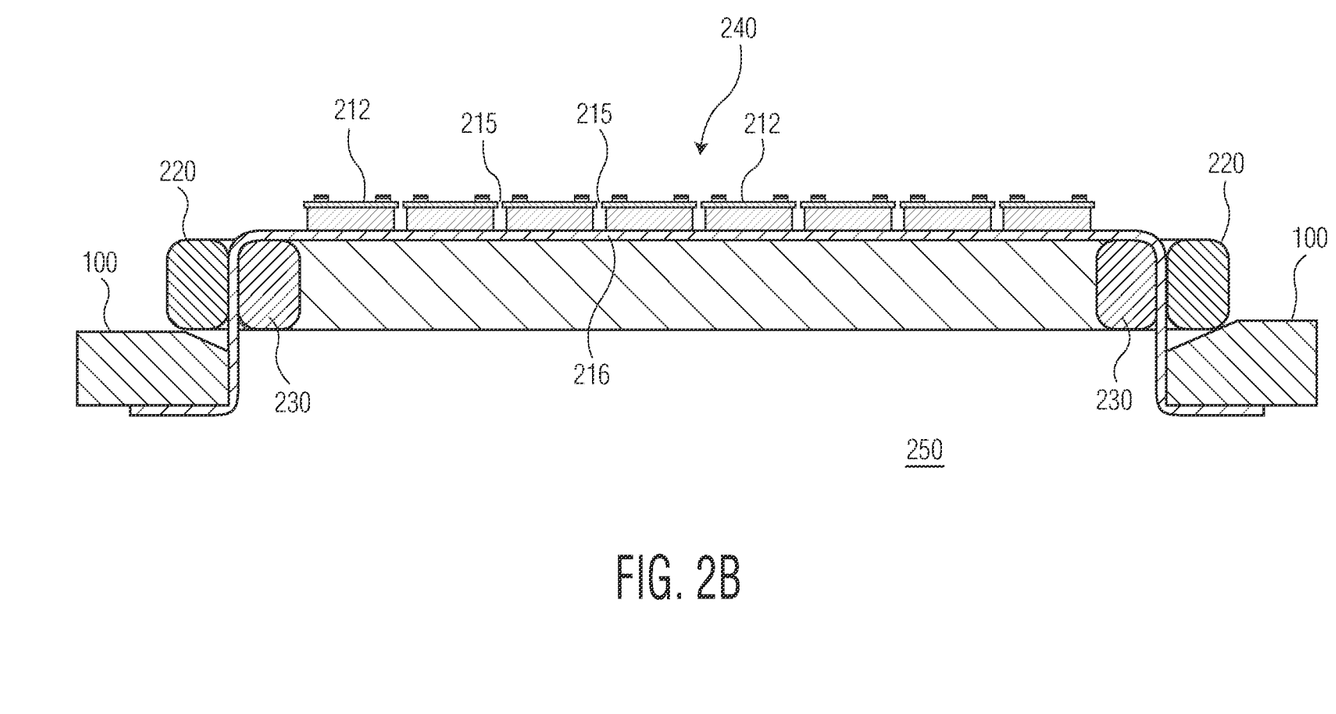
FIG. 2B is a cross-sectional side view of the configuration of FIG. 2A after the FFC inner ring has been pushed into the FFC outer ring.

FIG. 2B is a cross-sectional side view of the configuration of FIG. 2A after the FFC inner ring 230 has been pushed into the FFC outer ring 220. As the FFC inner ring 230 is pushed through the circular opening 102 of the FFC frame 100 and into the FFC outer ring 220, the tight fit between those components ensures that the dicing tape 216 gets stretched laterally, thereby causing the saw bows 214 of FIG. 2A to break and leaving gaps 215 between adjacent integrated circuits 212 in the resulting integrated circuit/tape assembly 240, which is now secured to the FFC frame 100 as assembly 250 for further handling (e.g., storage and/or shipping).

Figure 2C:
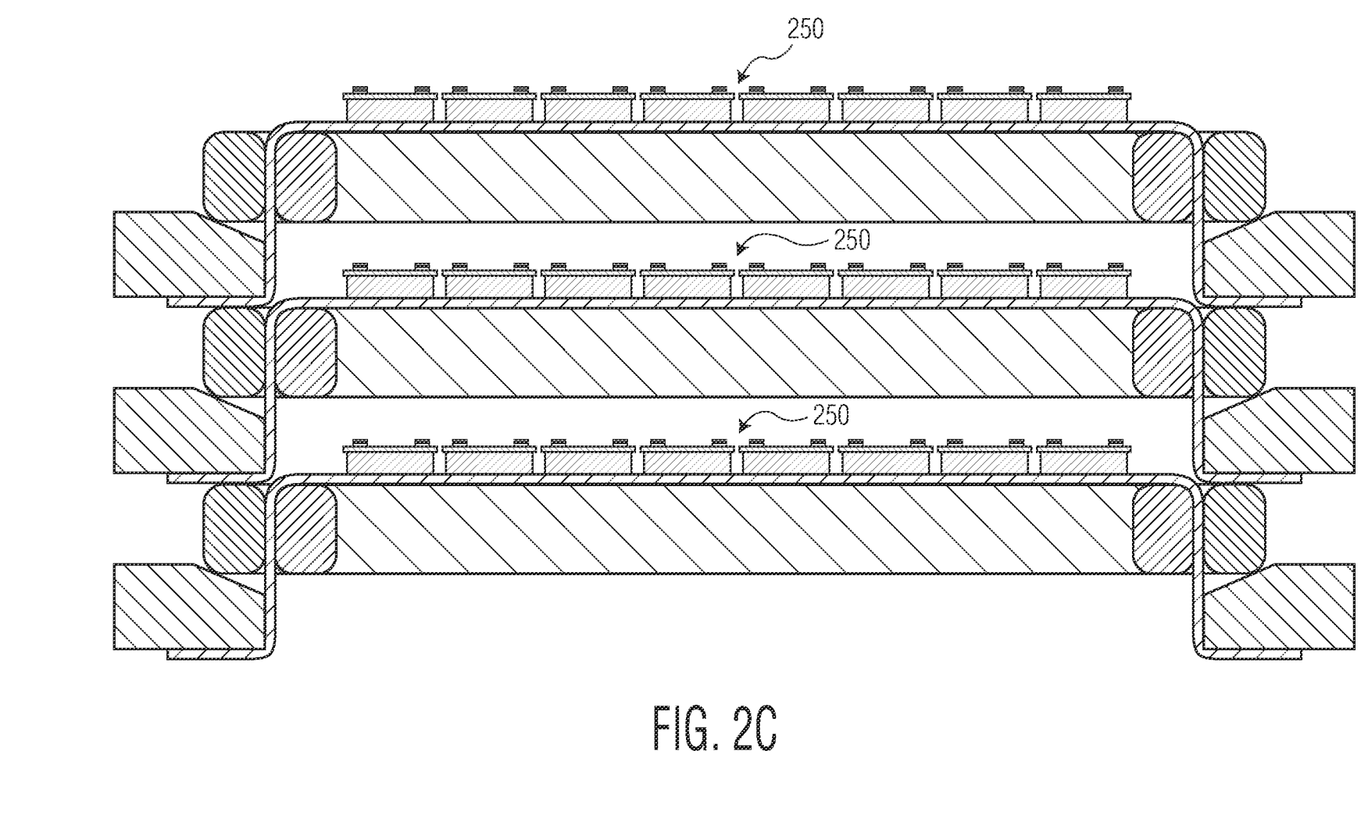
FIG. 2C is a cross-sectional side view of three instances of the assembly of FIG. 2B stacked on top of one another for storage and/or shipping.

FIG. 2C is a cross-sectional side view of three instances of the assembly 250 of FIG. 2B stacked on top of one another for storage and/or shipping.

One of the problems with the conventional FFC of FIGS. 1-2 is that the height of the resulting assemblies 250 is undesirably large. In typical implementations, the height of the conventional assembly 250 of FIG. 2B is about 3.5 mm. As such, the assembly 250 takes up a considerable volume of space for shipping and storage. Furthermore, the grip rings 220 and 230 are expensive compared to the cost of the FFC frame 100.

Figure 2D:
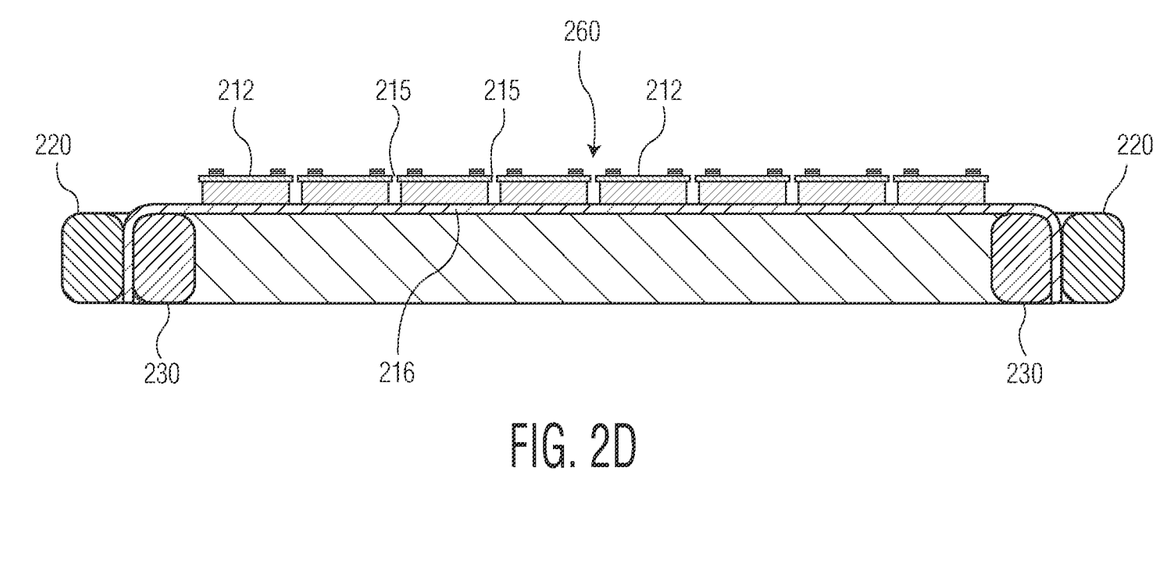
FIG. 2D is a cross-sectional side view of the assembly of FIG. 2B after (i) the dicing tape has been cut at the interface between the FFC frame and the two concentric rings and (ii) the FFC frame has been removed.
Figure 3A:
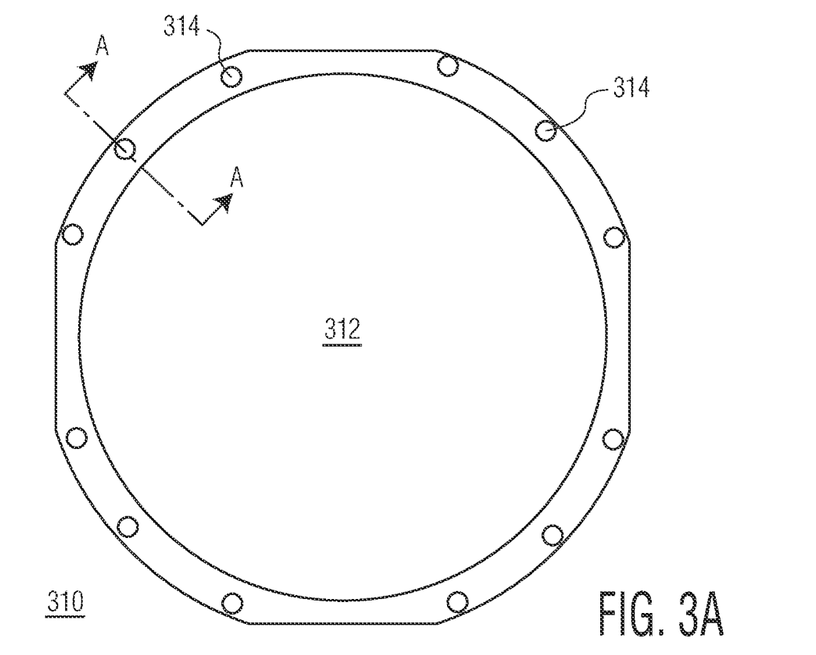
FIGS. 3A and 3B show respective plan views of a top FFC frame and a bottom FFC frame of a film frame carrier according to one embodiment of this disclosure.
Figure 3B:
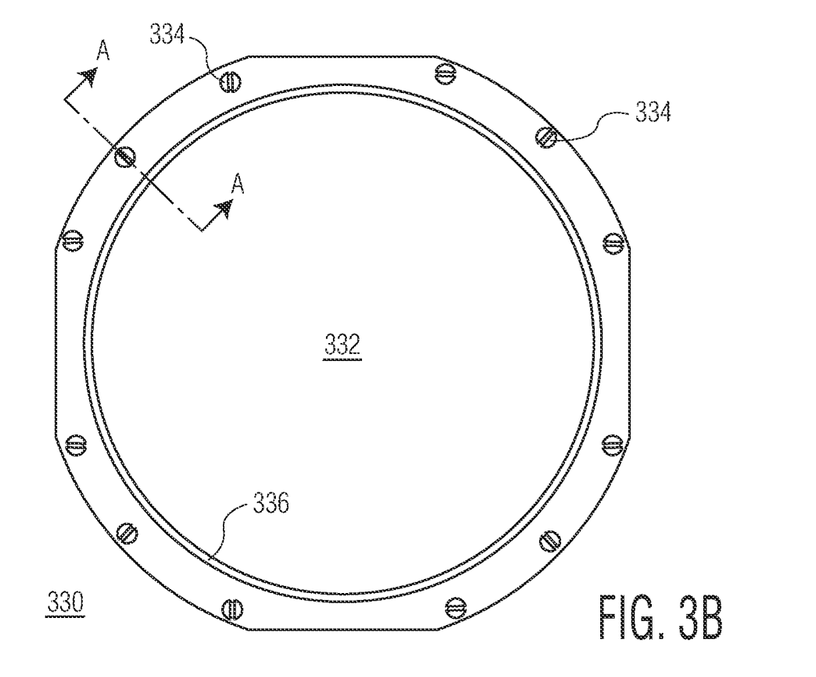

FIG. 2D is a cross-sectional side view of an assembly 260 after (i) the dicing tape 216 of FIG. 3B has been cut at the interface between the FFC frame 100 and the two concentric rings 220 and 230 and (ii) the FFC frame 100 has been removed. These steps are performed after shipping and/or storage just before the assembly 260 is placed into a die bonder. This technique is not preferred for high-density wafers and/or for wafers having a diameter of 300 mm or larger.

BRIEF DESCRIPTION OF THE DRAWINGS

Embodiments of the disclosure will become more fully apparent from the following detailed description, the appended claims, and the accompanying drawings in which like reference numerals identify similar or identical elements.

FIG. 4B is a cross-sectional side view corresponding to the view of FIG. 4A after the top and bottom FFC frames have been mated together with a diced wafer/tape assembly, similar to the assembly of FIG. 2A, positioned in between;

FIG. 4C is a cross-sectional side view of the top and bottom FFC frames of FIGS. 4A and 4B mated together with the integrated circuit/tape assembly of FIG. 2B positioned in between;

Note that the figures in this disclosure are not necessarily drawn to scale.

DETAILED DESCRIPTION

Detailed illustrative embodiments of the present disclosure are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of example embodiments of the disclosure.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functions/acts involved.

FIGS. 3A and 3B show respective plan views of a top FFC frame 310 and a bottom FFC frame 330 of a film frame carrier according to one embodiment of this disclosure. As represented in FIGS. 3A and 3B and as explained further below, the bottom FFC frame 330 has a number of barbed pegs 334 located around its periphery, and the top FFC frame 310 has a corresponding number of corresponding peg holes 314 located around its periphery. In addition, each FFC frame 310/330 has a corresponding circular opening 312/332, and the bottom FFC frame 330 has a circular inner rim 336.

Figure 4A:
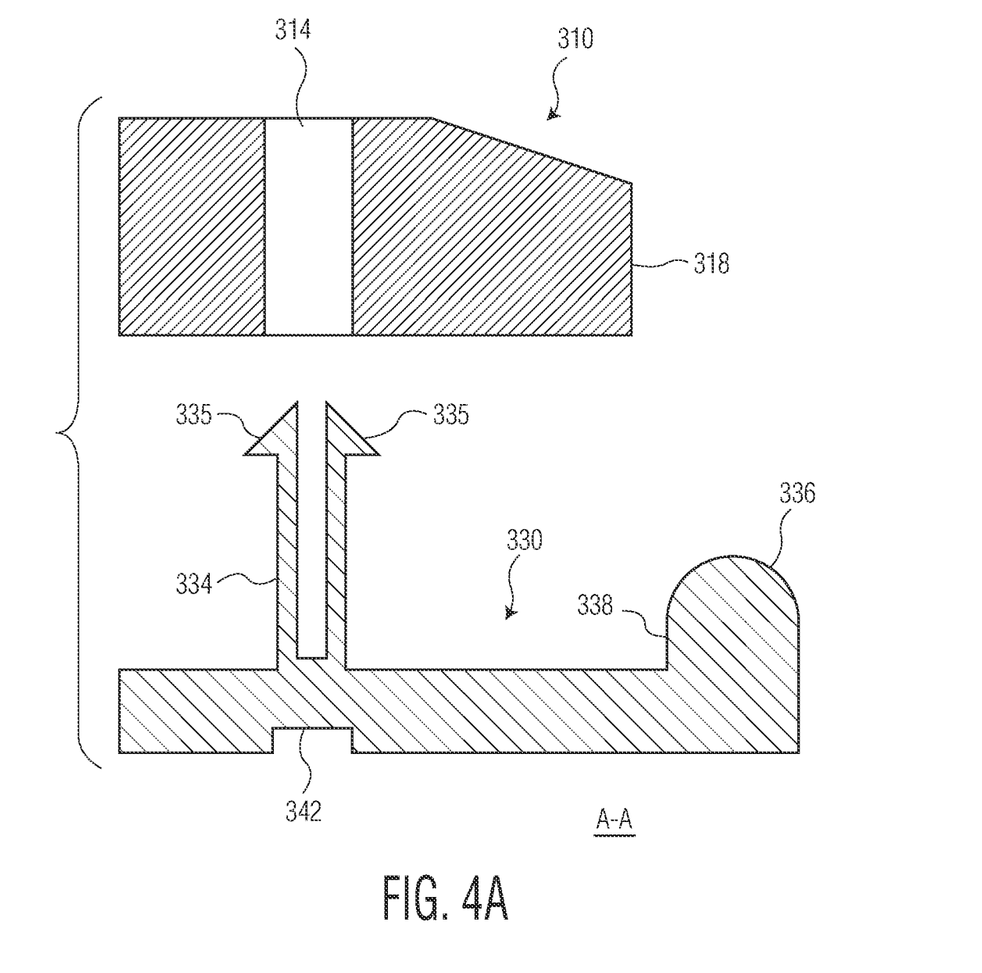
FIG. 4A is a cross-sectional side view along the cut lines A-A of FIGS. 3A and 3B of the top FFC frame positioned above the bottom FFC frame.

FIG. 4A is a cross-sectional side view along the cut lines A-A of FIGS. 3A and 3B of the top FFC frame 310 positioned above the bottom FFC frame 330. As shown in FIG. 4A, the barbed peg 334 of the bottom FFC frame 330 is aligned with the peg hole 314 of the top FFC frame 310. The barbed peg 334 has two opposing barbed tines 315 that deflect inward within the peg hole 314 as the top and bottom FFC frames are mated together. The bottom FFC frame 330 also has the circular inner rim 336 that helps to align the two FFC frames as they are mated together. Note that the diameter of the circular opening 332 of the top FFC frame 310 is slightly larger than the outer diameter of the rim 336 of the bottom FFC frame 330 such that there will be a gap between the inner surface 318 of the top FFC frame 310 and the outer surface 338 of the rim 336 of the bottom FFC frame 330 when the two frames are mated together.

Figure 4B:
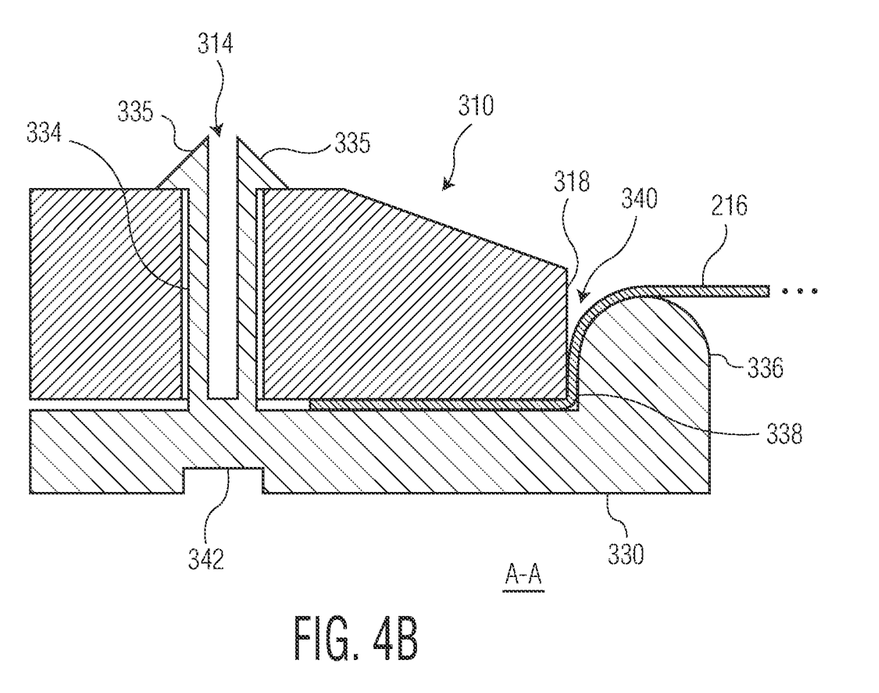

FIG. 4B is a cross-sectional side view corresponding to the view of FIG. 4A after the top and bottom FFC frames 310 and 330 have been mated together with a diced wafer/tape assembly, similar to the assembly 210 of FIG. 2A, positioned in between, where only the dicing tape 216 of the assembly 210 is represented in FIG. 4B. The ellipses ( . . . ) indicate that the rest of the assembly 210/240 is to the right in the view of FIG. 4B. FIG. 4B shows the barbed peg 334 of the bottom FFC frame 330 fully engaged within the peg hole 314 of the top FFC frame 310 with the barbed tines 315 keeping the two FFC frames mated together. FIG. 4B also shows the gap 340 between the inner surface 318 of the top FFC frame 310 and the outer surface 338 of the rim 336 of the bottom FFC frame 330. As the two FFC frames 310 and 330 are mated together with the assembly 210 in between them, the dicing tape 216 is pulled over the rim 336 of the bottom FFC frame 330, thereby stretching the dicing tape 216 laterally in all directions causing the saw bows 214 of the assembly 210 to break and establishing the gaps 215 of FIG. 2B between the integrated circuits 212. The mated FFC frames with the intervening integrated circuit/tape assembly can then be handled for storage and/or shipping for subsequent processing.

Figure 4C:
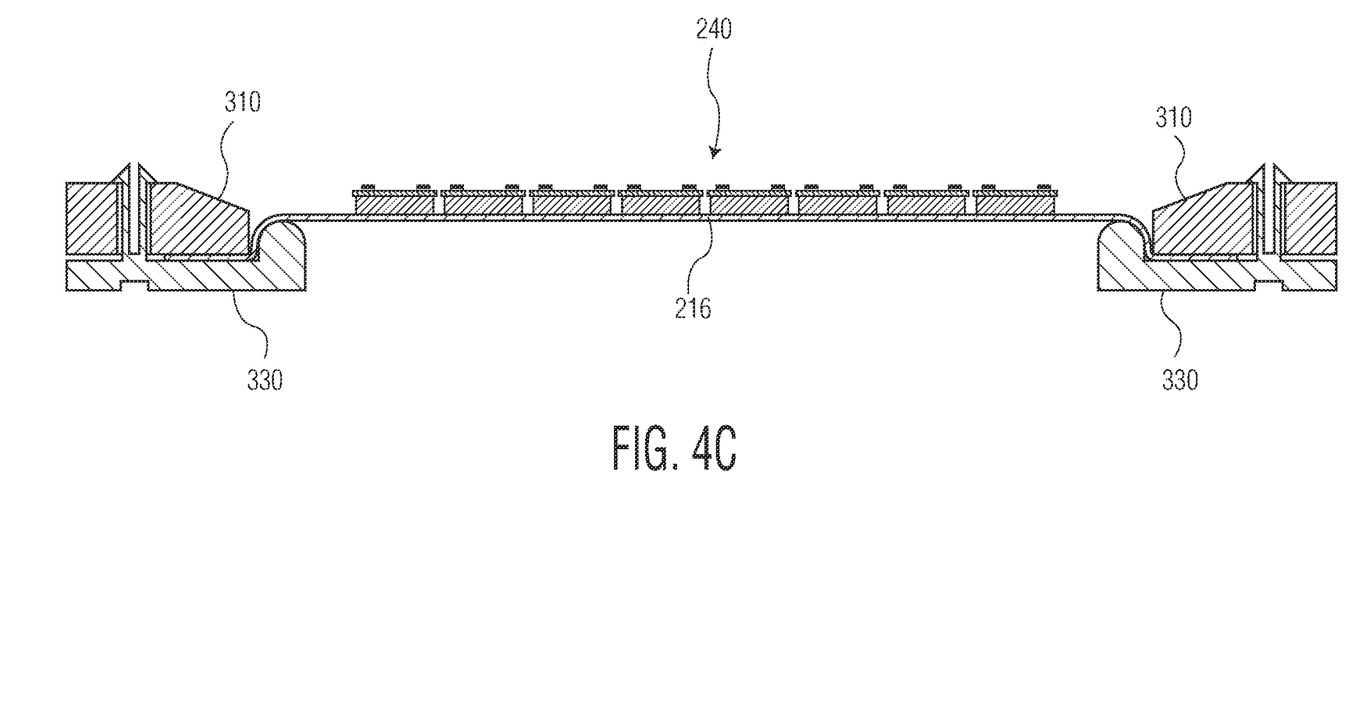

FIG. 4C is a cross-sectional side view of the top and bottom FFC frames 310 and 330 mated together with the integrated circuit/tape assembly 240 of FIG. 2B positioned in between.

As shown in FIGS. 4A-4C, the bottom FFC frame 330 can have an optional recess 342 that enables multiple instances of the assembly of FIG. 4B to be stacked on top of one another for shipment and/or storage.

Figure 5:
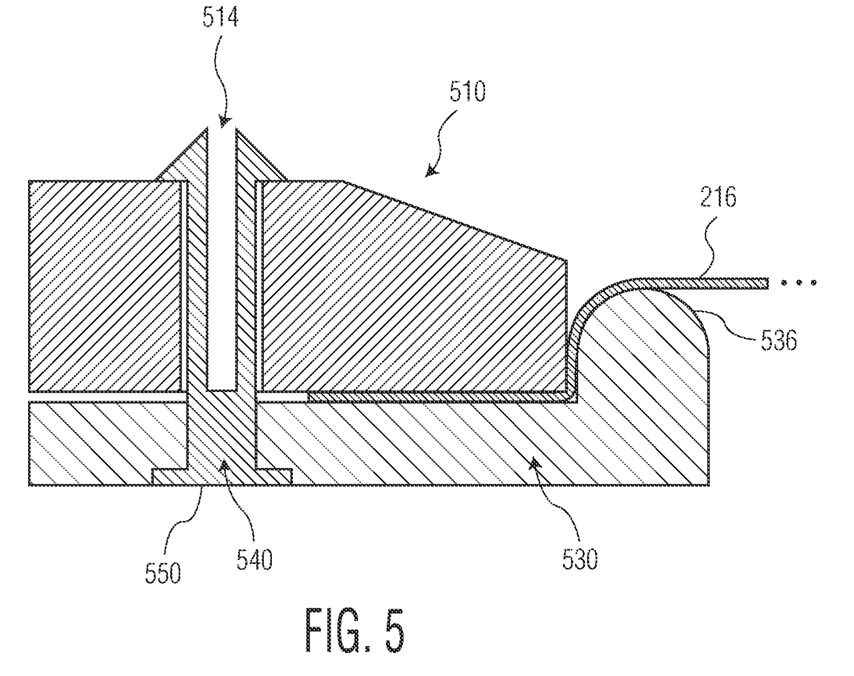
FIG. 5 is a cross-sectional side view of a top FFC frame mated to a bottom FFC frame stretching the dicing tape of an intervening diced wafer/tape assembly, according to another embodiment of the disclosure.

FIG. 5 is a cross-sectional side view of a top FFC frame 510 mated to a bottom FFC frame 530 stretching the dicing tape 216 of an intervening assembly 210/240, according to another embodiment of the disclosure. Unlike the bottom FFC frame 330 of FIGS. 3A and 4A-4C in which the barbed pegs 334 are integral to the bottom FFC frame, in the embodiment of FIG. 5, the barbed pegs 550 are separate elements that are inserted through a hole 540 in the bottom FFC frame 530 and then through a corresponding hole 514 in the top FFC frame 510. Note that the top FFC frame 510 may be identical to the top FFC frame 310 of FIGS. 3B and 4A-4C and that the bottom FFC frame 530 has a rim 536 that is similar to the rim 336 of the bottom FFC frame 330 of FIGS. 3A and 4A-4C. The ellipses ( . . . ) indicate that the rest of the assembly 210/240 is to the right in the view of FIG. 5.

Figure 6:
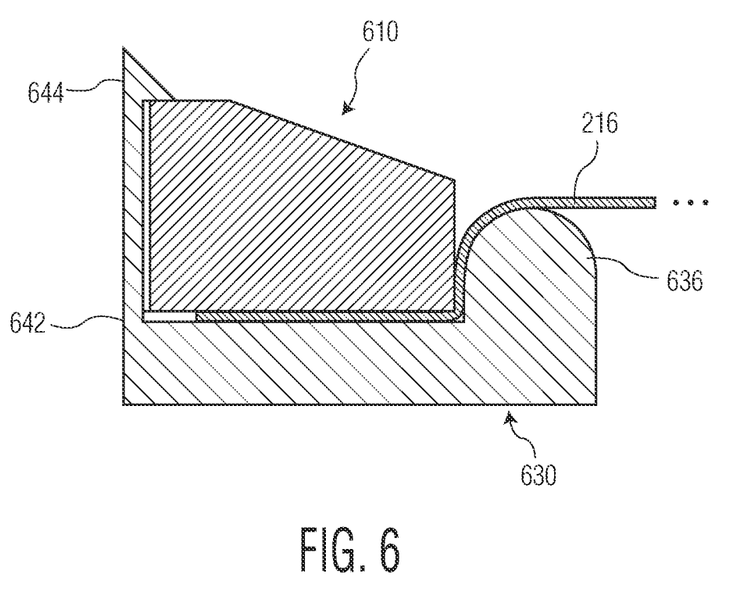
FIG. 6 is a cross-sectional side view of a top FFC frame mated to a bottom FFC frame stretching the dicing tape of an intervening diced wafer/tape assembly, according to yet another embodiment of the disclosure.

FIG. 6 is a cross-sectional side view of a top FFC frame 610 mated to a bottom FFC frame 630 stretching the dicing tape 216 of an intervening assembly 210/240, according to yet another embodiment of the disclosure. In this embodiment, the top FFC frame 610 does not need to have any peripheral holes analogous to the holes 314 and 514 of the previous embodiments. Instead, the bottom FFC frame 630 has an outer barbed structure 642 having a barbed top 644 that engages the outer diameter of the top FFC frame 610 and keeps the mated FFC frames 610 and 630 together. Here, too, the bottom FFC frame 630 has a rim 636 that is similar to the rims 336 and 536 of the previous embodiments. The ellipses ( . . . ) indicate that the rest of the assembly 210/240 is to the right in the view of FIG. 6.

Figure 7A:
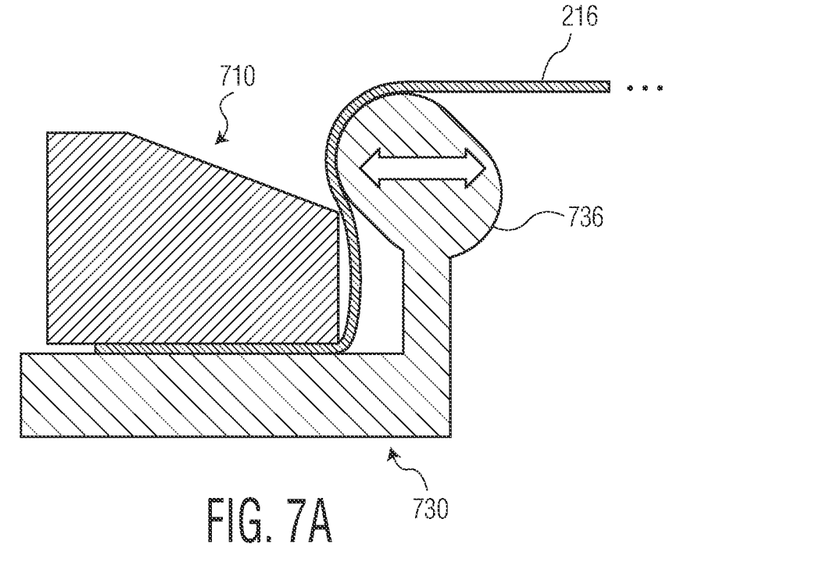
FIG. 7A is a cross-sectional side view of a top FFC frame mated to a bottom FFC frame stretching the dicing tape of an intervening diced wafer/tape assembly, according to yet another embodiment of the disclosure.

FIG. 7A is a cross-sectional side view of a top FFC frame 710 mated to a bottom FFC frame 730 stretching the dicing tape 216 of an intervening assembly 210/240, according to yet another embodiment of the disclosure. In this embodiment, instead of a rim as in the previous embodiments, the bottom FFC frame 730 has a number of flexible pegs 736 located around the inner edge of the frame that perform the dual function of stretching the dicing tape 216 and securing the two FFC frames 710 and 730 together. The arrow in FIG. 7A indicates the direction that the flexible peg 736 bends as the two FFC frames are mated together. The ellipses ( . . . ) indicate that the rest of the assembly 210/240 is to the right in the view of FIG. 7A.

Figure 7B:
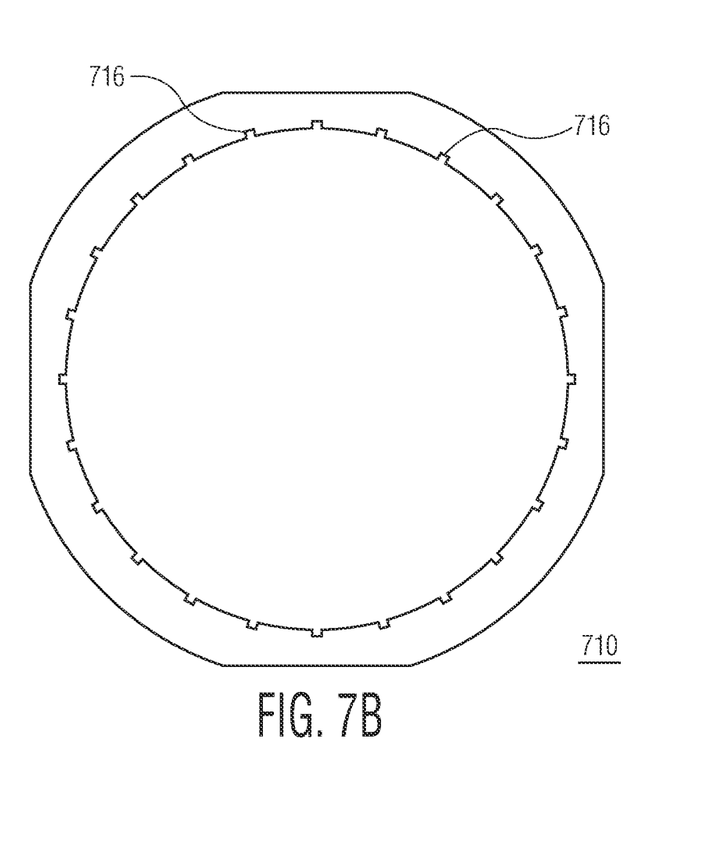
FIG. 7B is a plan view of the top FFC frame of FIG. 7A.

FIG. 7B is a plan view of the top FFC frame 710 of FIG. 7A. As shown in FIG. 7B, the top FFC frame 710 has a number of notches 716 located around the inner edge of the frame and corresponding to the locations of the flexible pegs 736 of the bottom FFC frame 730, where the notches 716 receive the flexible pegs 736 to support the mating of the frames together.

In certain embodiments, the FFC top frames 310, 510, and 610, the FFC bottom frames 330, 530, and 630, and the barbed pegs 550 are made of suitable types of plastic and formed by injection molding.

In certain implementations, the height of an FFC of the present disclosure, as dictated by the height of the corresponding structures 334, 550, 642, or 736, is about 3 mm. In this way, the height of the two pieces of FFCs of the present disclosure can be substantially equal to the height of the prior-art FFC described above.

Although the present disclosure has been described in the context of FFCs in which that FFC frames have circular openings, in alternative embodiments, the FFC frames may have openings having a suitable shape other than circular (e.g., rectangular), as long as the rim or flexible pegs of the bottom FFC frame form an appropriate shape that stretches the dicing tape of the wafer/tape assembly in an appropriate manner. Note that, at a minimum, the circular or non-circular shape formed by the rim or flexible pegs should stretch the dicing tape in the mutually orthogonal directions corresponding to the rows and columns of IC dies on the diced wafer in order to break the saw bows 214 of FIG. 2A.

Although the present disclosure has been described in the context of FFCs in which barbed structures 334, 550, and 642 are used to hold the top and bottom FFC frames together, in alternative embodiments, other mechanisms are used to hold the top and bottom FFC frames together, such as clips or clamps that are applied around the periphery of the mated FFC frames. In some embodiments, the mated FFC frames may be held together by a friction fit between the top and bottom FFC frames and the intervening dicing tape 216 filling the gap (e.g., 340 of FIG. 4B) between the FFC frames.

According to certain embodiments, disclosed is an apparatus for retaining an integrated circuit/tape assembly comprising a plurality of integrated circuits supported by underlying dicing tape. The apparatus comprises (i) a top film frame carrier (FFC) frame having a central opening and (ii) a bottom FFC frame having structure, wherein, when the top and bottom FFC frames are mated together with the integrated circuit/tape assembly, the dicing tape is pulled over the structure thereby laterally stretching the dicing tape.

According to certain other embodiments, disclosed is a method for handling an integrated circuit/tape assembly comprising a plurality of integrated circuits supported by underlying dicing tape. The method comprises (i) placing the integrated circuit/tape assembly on a bottom FFC frame having structure; (ii) placing a top FFC frame having a central opening over the integrated circuit/tape assembly; and (iii) mating the top and bottom FFC frames such that the dicing tape is pulled over the structure thereby laterally stretching the dicing tape.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this disclosure may be made by those skilled in the art without departing from embodiments of the disclosure encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the disclosure.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

What is claimed is:

1. Apparatus for retaining an integrated circuit/tape assembly comprising a plurality of integrated circuits supported by underlying dicing tape, the apparatus comprising:
   a top film frame carrier (FFC) frame having a central opening;
   a bottom FFC frame having structure, wherein, when the top and bottom FFC frames are mated together with the integrated circuit/tape assembly, the dicing tape is pulled over the structure thereby laterally stretching the dicing tape; and
   structures for holding the mated top and bottom FFC frames together, wherein the structures are barbed pegs that are integral to the bottom FFC frame and are configured to be inserted through peripheral holes in the top FFC frame.

2. The apparatus of claim 1, wherein the lateral stretching of the dicing tape occurs in at least two mutually orthogonal lateral directions to break wafer saw bows holding the integrated circuits together.

3. The apparatus of claim 1, wherein the central opening in the top FFC frame is a circular opening that receives the integrated circuits of the integrated circuit/tape assembly.

4. The apparatus of claim 3, wherein the bottom FFC frame has a circular central opening.

5. The apparatus of claim 1, wherein the lateral stretching of the dicing tape increases distance between adjacent integrated circuits, thereby inhibiting the adjacent integrated circuits from colliding during shipment or storage.

6. The apparatus of claim 1, wherein the inner diameter of the central opening in the top FFC is greater than the outer diameter of the structure of the bottom FFC such that the dicing tape is stretched over the structure as the bottom FFC is mated to the top FFC.

7. The apparatus of claim 1, wherein the structure comprises a plurality of flexible pegs that stretch the dicing tape and secure the mated top and bottom FFC frames together.

8. Apparatus for handling an integrated circuit/tape assembly comprising a plurality of integrated circuits supported by underlying dicing tape, the apparatus comprising:
   a bottom film frame carrier (FFC) frame having structure, the bottom FFC frame configured for placement of the integrated circuit/tape assembly; and
   a top FFC frame having a central opening, the top FFC frame configured for mating with the bottom FFC frame such that the dicing tape is pulled over the structure thereby laterally stretching the dicing tape when mated together, the structure including a plurality of flexible pegs configured to stretch the dicing tape and secure the mated top and bottom FFC frames together.

9. The apparatus of claim 8, wherein the lateral stretching of the dicing tape occurs in at least two mutually orthogonal lateral directions to break wafer saw bows holding the integrated circuits together.

10. The apparatus of claim 8, wherein the central opening in the top FFC frame is a circular opening configured for receiving the integrated circuits of the integrated circuittape assembly.

11. The apparatus of claim 8, wherein the bottom FFC frame has a circular central opening.

12. The apparatus of claim 8, wherein the lateral stretching of the dicing tape increases distance between adjacent integrated circuits, thereby inhibiting the adjacent integrated circuits from colliding during shipment or storage.

13. The apparatus of claim 8, wherein the inner diameter of the central opening in the top FFC is greater than the outer diameter of the structure of the bottom FFC such that the dicing tape is stretched over the structure when the bottom FFC is mated to the top FFC.

14. The apparatus of claim 8, further comprising barbed structures configured to hold the mated top and bottom FFC frames together.

15. The apparatus of claim 14, wherein the barbed structures are integral to the bottom FFC frame and are configured to be inserted through corresponding peripheral holes located in the top FFC frame.

16. The apparatus of claim 14, wherein the barbed structures are integral to the bottom FFC frame and are configured to engage an outer periphery of the top FFC frame.

17. Apparatus for retaining an integrated circuit/tape assembly comprising a plurality of integrated circuits supported by underlying dicing tape, the apparatus comprising:
   a top film frame carrier (FFC) frame having a central opening;
   a bottom FFC frame having structure, wherein, when the top and bottom FFC frames are mated together with the integrated circuit/tape assembly, the dicing tape is pulled over the structure thereby laterally stretching the dicing tape; and
   structures for holding the mated top and bottom FFC frames together, wherein the structures comprise barbed pegs configured to be inserted through peripheral holes in the bottom FFC frame and corresponding peripheral holes in the top FFC frame.

18. The apparatus of claim 17, wherein the lateral stretching of the dicing tape occurs in at least two mutually orthogonal lateral directions to break wafer saw bows holding the integrated circuits together.

19. Apparatus for retaining an integrated circuit/tape assembly comprising a plurality of integrated circuits supported by underlying dicing tape, the apparatus comprising:
   a top film frame carrier (FFC) frame having a central opening;
   a bottom FFC frame having structure, wherein, when the top and bottom FFC frames are mated together with the integrated circuit/tape assembly, the dicing tape is pulled over the structure thereby laterally stretching the dicing tape; and
   structures for holding the mated top and bottom FFC frames together, wherein the structures comprise barbed structures that are integral to the bottom FFC frame and are configured to engage an outer periphery of the top FFC frame.

20. The apparatus of claim 19, wherein the lateral stretching of the dicing tape occurs in at least two mutually orthogonal lateral directions to break wafer saw bows holding the integrated circuits together.

* * * * *